(12) United States Patent
Mainini et al.

(10) Patent No.: US 10,521,523 B2
(45) Date of Patent: Dec. 31, 2019

(54) COMPUTER SIMULATION OF ANIMAL TRAINING SCENARIOS AND ENVIRONMENTS

(71) Applicant: Radio Systems Corporation, Knoxville, TN (US)

(72) Inventors: Christopher E Mainini, Knoxville, TN (US); William S Groh, Knoxville, TN (US)

(73) Assignee: Radio Systems Corporation, Knoxville, TN (US)

( * ) Notice: Subject to any disclaimer, the term of this patent is extended or adjusted under 35 U.S.C. 154(b) by 941 days.

(21) Appl. No.: 14/988,344

(22) Filed: Jan. 5, 2016

(65) Prior Publication Data

US 2017/0039301 A1     Feb. 9, 2017

Related U.S. Application Data

(63) Continuation-in-part of application No. 14/842,512, filed on Sep. 1, 2015.
(Continued)

(51) Int. Cl.
*G06G 7/48*        (2006.01)
*G06F 17/50*     (2006.01)
(Continued)

(52) U.S. Cl.
CPC ........ *G06F 17/5009* (2013.01); *A01K 15/021* (2013.01); *A01K 29/005* (2013.01)

(58) Field of Classification Search
None
See application file for complete search history.

(56) References Cited

U.S. PATENT DOCUMENTS 5,620,326 A * 4/1997 Younker ................ G09B 23/28
                                                   434/268
5,868,103 A     2/1999 Boyd
(Continued)

FOREIGN PATENT DOCUMENTS

WO     WO-2014182626 A1     11/2014

OTHER PUBLICATIONS

CBS News 60 minutes program aired Oct. 5, 2014 "The Smartest Dog in the World".
(Continued)

*Primary Examiner* — Rehana Perveen
*Assistant Examiner* — Nithya J. Moll

(57) ABSTRACT

A method is described herein that comprises selecting a training objective, wherein the training objective comprises an objective to teach an animal to perform a behavior in an environment. The method includes testing the animal to determine a profile. The method includes identifying an optimal training product for the animal based on the profile. The method includes identifying an optimal training protocol for the animal based on the profile. The method includes simulating an experience of teaching the animal the behavior in a virtual training environment using the optimal training product and the optimal training protocol, the simulating including one or more applications running on a computing device for providing a virtual training environment, wherein the virtual training environment mimics the environment.

32 Claims, 10 Drawing Sheets

Related U.S. Application Data

(60) Provisional application No. 62/201,666, filed on Aug. 6, 2015.

(51) Int. Cl.
*A01K 29/00* (2006.01)
*A01K 15/02* (2006.01)

(56) References Cited

U.S. PATENT DOCUMENTS

| | | | |
|---|---|---|---|
| 5,927,233 A | 7/1999 | Mainini | |
| 6,415,742 B1 | 7/2002 | Lee | |
| 6,598,563 B2 | 6/2003 | Kim | |
| 6,651,592 B2 | 8/2003 | Maddox | |
| 6,722,973 B2* | 4/2004 | Akaishi | G06N 3/006 446/143 |
| 7,275,502 B2 | 6/2007 | Boyd | |
| 7,409,924 B2 | 8/2008 | Kates | |
| 7,650,855 B2 | 1/2010 | Krishnamurthy | |
| 7,992,525 B1 | 8/2011 | Fisher | |
| 8,011,327 B2 | 9/2011 | Mainini | |
| 8,069,823 B2 | 12/2011 | Mainini | |
| 8,578,882 B2 | 11/2013 | Araujo | |
| 8,596,220 B2 | 12/2013 | Mainini | |
| 8,776,723 B2 | 1/2014 | Araujo | |
| 9,107,389 B2 | 1/2015 | Levi | |
| 8,944,006 B2 | 2/2015 | Anderson | |
| 8,947,240 B2 | 2/2015 | Mainini | |
| 8,978,585 B2 | 3/2015 | Araujo | |
| 9,043,993 B1 | 6/2015 | James | |
| 9,776,723 B2 | 10/2017 | Gow et al. | |
| 9,881,515 B2* | 1/2018 | Moreno | G09B 19/00 |
| 2002/0073931 A1 | 6/2002 | Boesch | |
| 2003/0027636 A1 | 2/2003 | Covannon | |
| 2003/0046092 A1 | 3/2003 | Araujo | |
| 2003/0083789 A1 | 5/2003 | Kalley | |
| 2003/0118979 A1 | 6/2003 | Axelrod | |
| 2005/0123892 A1 | 6/2005 | Cornelius | |
| 2006/0011146 A1 | 1/2006 | Kates | |
| 2006/0136786 A1 | 6/2006 | Nonaka | |
| 2006/0196445 A1 | 9/2006 | Kates | |
| 2006/0196446 A1 | 9/2006 | Kates | |
| 2006/0219187 A1 | 10/2006 | Krishnamurthy et al. | |
| 2008/0236514 A1 | 10/2008 | Johnson | |
| 2008/0274811 A1 | 11/2008 | Ganz | |
| 2011/0136086 A1 | 6/2011 | Saul | |
| 2012/0077159 A1 | 3/2012 | Araujo | |
| 2012/0288160 A1 | 11/2012 | McVey | |
| 2013/0233252 A1 | 9/2013 | Bellon | |
| 2014/0224186 A1 | 8/2014 | Bianchi | |
| 2014/0272863 A1 | 9/2014 | Kim | |
| 2014/0308647 A1 | 10/2014 | Shimata | |
| 2015/0170539 A1 | 6/2015 | Barrera | |
| 2015/0208612 A1 | 7/2015 | Bianchi | |
| 2016/0042038 A1* | 2/2016 | Schumacher | G06F 16/24575 707/722 |
| 2016/0125765 A1 | 5/2016 | Meretei | |
| 2016/0302386 A1* | 10/2016 | Li et al. | |

OTHER PUBLICATIONS

Website for dog testing at www.dognition.com Believed to have been set up by Feb. 15, 2013.
Facebook pages at www.facebook.com /chaserthebc originally set up in 2011.
Website for the book "The Genius of Dogs" Believed to have been set up by Feb. 15, 2013.
Website for dog training at support.dognition.com/knowledgebase Believed to have been set up by Jun. 1, 2013.
Website for dog training at http://thedogtrainingsecret.com Believed to have been set up by Oct. 1, 2014.
Website discussing dog training at http://cosmiclog.nbcnews.com Believed to have been set up by Feb. 13, 2013.
Book by Pamela J. Reid, "It's Not Just Semantics . . . Words Do Matter", pp. 351-356 (Nov./Dec. 2005).
The magazine Article at http://ideas.time.com/2013/11/05 "Meet the Dog Who Knows 1,000 Words" (Nov. 11, 2013).
Website for understanding dog breeds at http://dogtime.com/dogbreeds Publication dates unknown.
John W. Pilley, Chaser: Unlocking the Genius of the Dog Who Knows a Thousand Words, Chapter 5 (2013).
John W. Pilley, Chaser: Unlocking the Genius of the Dog Who Knows a Thousand Words, Chapter 7 (2013).
John W. Pilley, Chaser: Unlocking the Genius of the Dog Who Knows a Thousand Words, Chapter 10 (2013).
Canine Patient Simulators, www.decodedscience.org (Nov. 2011).
International Search Report, and Transmittal, dated Dec. 2, 2016, from PCT/US2016/46034.
Written Opinion of the International Searching Authority, dated Dec. 2, 2016, from PCT/US2016/46034.
Extended European Search Report for European Application No. 16833998.4 dated Mar. 4, 2019, 8 pages.
International Preliminary Report on Patentability for Application No. PCT/US2016/046021 dated Feb. 6, 2018, 9 pages.
International Preliminary Report on Patentability for Application No. PCT/US2016/046034 dated Feb. 6, 2018, 9 pages.
International Search Report and Written Opinion for Application No. PCT/US2016/046034 dated Dec. 2, 2016, 12 pages.
Notification of Transmittal of the International Search Report for Application No. PCT/US2016/046021 dated Oct. 21, 2016, 3 pages.
Written Opinion of the International Application No. PCT/US2016/046021 dated Oct. 21, 2016, 8 pages.

* cited by examiner

300

| PERSONALITY SPECTRA |||||||||
|---|---|---|---|---|---|---|---|
| ORANGE || GOLD || BLUE || GREEN ||
| ORANGE Card Sort Rank: | | GOLD Card Sort Rank: | | BLUE Card Sort Rank: | | GREEN Card Sort Rank: | |
| Active Playful Busy | | Obedient Loyal Dependable | | Devoted Sweet Kind | | Independent Curious Intelligent | |
| Fun Charming Spontaneous | | Stoic Clever Intense | | Needy Easy-going Affectionate | | Capable Stubborn Agile | |
| Happy Vivacious Engaging | | Heroic Strong Methodical | | Manipulative Eager Social | | Unique Task-Oriented Aloof | |
| Tenacious Confident Jubilant | | Gallant Workaholic Driven | | Loving Over-attached Pushy | | Precise Bonded Orderly | |
| ORANGE Total: | | GOLD Total: | | BLUE Total: | | GREEN Total: | |

32 — ORANGE Card Sort Rank row
34 — Active/Playful/Busy row
36 — Fun/Charming/Spontaneous row
38 — Happy/Vivacious/Engaging row
40 — Tenacious/Confident/Jubilant row
42 — Totals row 54 — ORANGE Total
56 — GOLD Total
58 — BLUE Total
60 — GREEN Total

FIG. 3

COMPUTER SIMULATION OF ANIMAL TRAINING SCENARIOS AND ENVIRONMENTS

CROSS REFERENCE TO RELATED APPLICATIONS

This application is a Continuation in Part application of U.S. application Ser. No. 14/842,512, filed Sep. 1, 2015, which claims the benefit of U.S. Provisional Patent Application No. 62/201,666 filed Aug. 6, 2015. Each such application to which priority is claimed is incorporated herein by reference in its entirety.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

BACKGROUND OF THE INVENTION

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

Field of the Invention

The present disclosure relates to the field of animal training. More specifically, the present invention relates to methods for training a canine based upon evaluations of the dog's personality and its intelligence. The application also relates to the selection of appropriate toys and training devices based upon such evaluations.

Discussion of Technology

It is known that dogs, like people, have different levels of intelligence. For canines, intelligence is a combination of breed and training. Intelligence is determined by the ability of the dog to learn, which generally means the ability to associate sounds or motions (sometimes referred to as "somatosensory feedback or biofeedback") with objects or actions.

The border collie (or Scotch sheep dog) is often considered to be the brightest dog. Other breeds that are considered to have higher cognitive skill levels include the golden retriever, the Labrador retriever, the Shetland sheepdog, the German shepherd, and the Doberman pinscher.

Studies into the thought processes and personality types of canines have recently been conducted by Professor Brian Hare at Duke University. Dr. Hare is the Director of the Duke Canine Cognition Center. Dr. Hare has determined that, compared to people, most dogs are considered to have the cognition of the average toddler. However, some dogs, such as border collies, are known (or at least widely believed) to have higher levels of conceptual learning.

Professor John W. Pilley of Wofford College recently authored a book about his dog Chaser. The title of the book is "Chaser: Unlocking the Genius of the Dog Who Knows a Thousand Words," (Houghton Mifflin Harcourt). See, e.g., "Meet the Dog Who Knows 1,000 Words," (Time Magazine Online, Nov. 5, 2013, http://ideas.time.com/2013/11/05/your-dog-is-a-toddler/). Chaser is an example of a highly trained border collie.

In contrast to border collies, some breeds are considered (fairly or unfairly) to have lower cognitive skill levels. These generally include the so-called hounds including the Afghan hound, the Basset hound, the Beagle and the bloodhound. Some have also placed the bulldog, the pug, the Chow Chow, the mastiff and the Pekingese in this lower category, although there are undoubtedly exceptions within each breed and individual dog owners may rightfully have strong feelings about their individual dog or their experiences with canine pets.

Criteria for determining the intelligence of a dog generally include sense of direction, memory, ability to be trained to follow basic commands (such as "sit" or "stay"), ability to adapt to new surroundings, and ability to navigate an obstacle course. Based on this criteria, one might expect that a dog who is more intelligent is more easily trained than a dog that has lower cognitive skills.

Dr. Hare has developed an on-line assessment for a dog. His website is found at www.dognition.com, and includes the heading "Is Your Dog a Genius?" A review of Dr. Hare's website reveals that the protocol for determining a dog's developmental level results in a dog being assigned to one of the following profiles: Ace, Charmer, Socialite, Expert, Renaissance Dog, ProtoDog, Einstein, Maverick and Stargazer. For example, the Charmer is described as follows:

Charmers have exceptional social skills, meaning they can read human body language like a book. Seeing as these social skills are paired with just the right amount of independent problem solving skills, it's no surprise that Charmers can be quite mischievous! Indeed, this combination of cognitive skills sets means that many Charmers are not above using their owner's social information to get their own way. Whether cooperative or sneaky, these dogs are deeply in tune with their owner and very clever.

https://www.dognition.com/profiles/charmer. (It is expected that Dr. Hare and his co-founders at Canines, Inc. have copyright protection on various aspects of the Dognition assessment protocol, including possibly the naming scheme, the software behind the website, artwork associated with the naming scheme, and the text of the website. Accordingly, Applicant seeks to use no more of this material herein than is minimally necessary to provide an appropriate patent application Background, and full attribution is given to Canines, Inc. of North Carolina.)

It has been suggested that just as different dogs have different cognitive skill levels, or abilities to learn, different dogs also have different personality types. U.S. Patent Publ. No. 2011/01396086 entitled "Systems and Methods for Generating Personality Profiles for Animals" disclosed the idea of generating a profile of animals in order to determine compatibility. Dogs were assigned one of the following categories for different personality traits: orange, gold, blue or green. A matrix was offered at FIG. 4 of the published application, which uses a scoring system to identify personality type for a Canine. FIG. 4 of U.S. Patent Publ. No. 2011/01396086 is somewhat duplicated herein as FIG. 3.

A need exists to improve upon the manner in which dogs are trained based upon cognitive skills and personality characteristics. Further, a need exists for identifying ways in which dogs are best entertained or taught using toys that are selected based upon intelligence, personality characteristics, or a combination thereof. Regarding training devices and developmental products, a need exists for a smarter and more efficient dog training device that can provide various types and levels of stimuli to the dog, both positive and negative.

BRIEF DESCRIPTION OF THE DRAWINGS

So that the manner in which the present application can be better understood, certain illustrations and figures are appended hereto. It is to be noted, however, that the drawings illustrate only selected embodiments and elements of the systems and methods described herein and are therefore not to be considered limiting in scope for the systems and methods as described herein may admit to other equally effective embodiments and applications.

FIG. 3 is a matrix used for scoring a dog based upon personality traits, under an embodiment. The matrix is derived from FIG. 4 of U.S. Patent Publ. No. 2011/01396086, under an embodiment.

DETAILED DESCRIPTION

Figure 1:
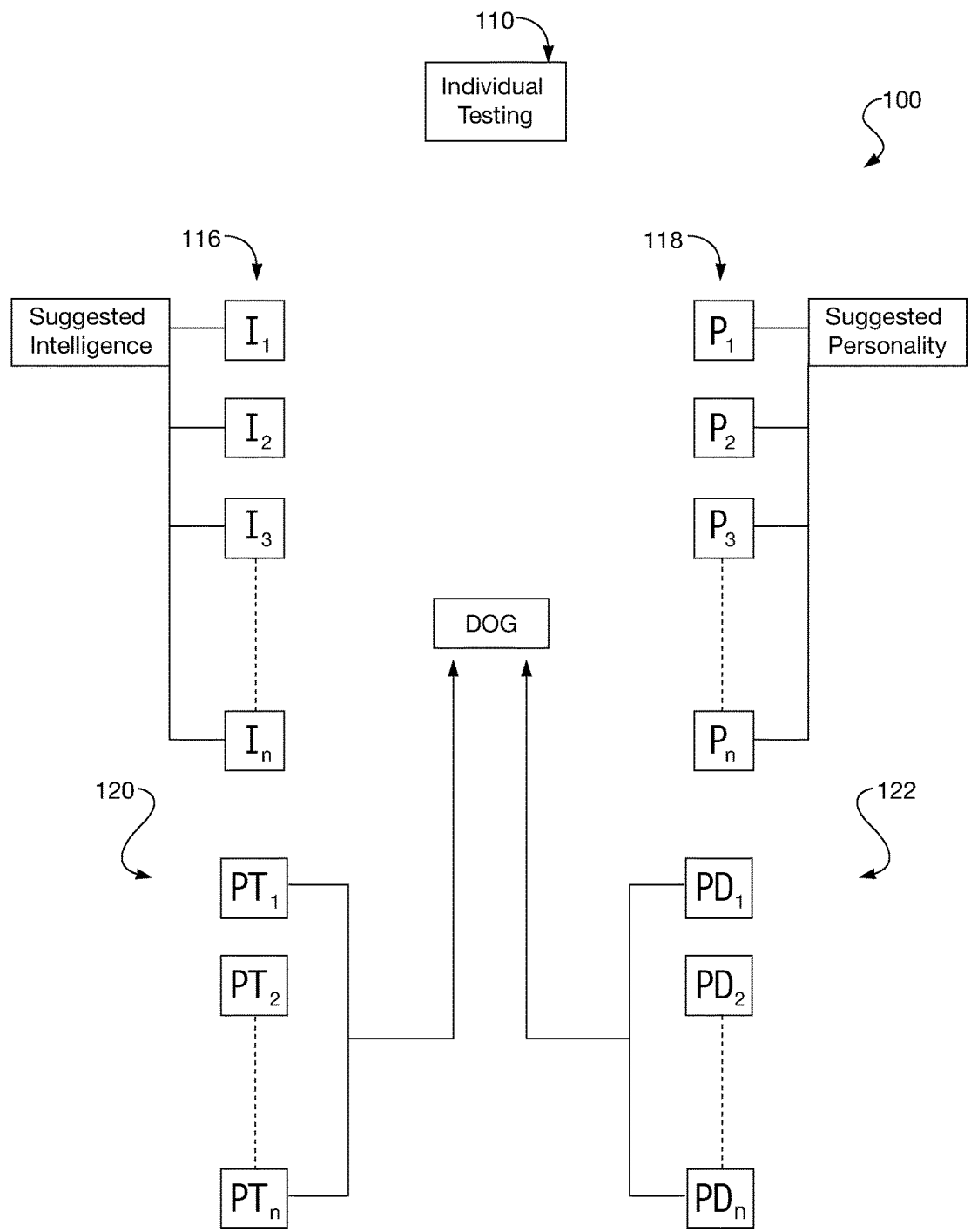
FIG. 1 shows a method for optimizing pet training products and training protocols, under an embodiment.

The training of an animal comprises two propositions. First, a trainer should identify appropriate methods and techniques for teaching the animal targeted or desired behaviors and responses. Second, the trainer should demonstrate sufficient skill and competence to implement the selected methods and techniques. Even if the ideal training product and method are identified for a particular breed of dog (i.e., a dog possessing a specific combination of personality and intelligence characteristics), a trainer may completely undermine the efficacy of the product/method through improper implementation. As a simple example, a breed that responds well to "on leash" training activities may quickly learn to fear the leash and corresponding training activities if the trainer aggressively applies leash control and/or delivers excessive negative feedback stimulus.

The following disclosure proceeds in two parts. First, systems and methods are described for identifying pet training products and protocols based on personality and intelligence of a canine. This first section teaches an initial assessment of the pet's personality and intelligence and subsequent use of this evaluation to match the pet with optimal training approaches. Second, systems and methods are described for training the trainer in the best practices for use of the identified training products and protocols.

Identification of Training Products and Protocols Using Personality and Intelligence Data Historically, the exceptional ability of dogs to get along with people has set them aside from all others in the animal kingdom. Their unique abilities to "communicate" with humans has made them "man's best friend." Recent advances in the research of dogs has identified areas of interest, including mental skills, spontaneous inferences and communicative intentions. In addition, research has shown that these, and other intelligence traits in dogs are individual pet specific traits. This means that dogs have varying degrees of skill in different areas.

Research continues to uncover details about the mental make-up of dogs. Opportunities arise to exploit these findings for the improvement of dog training methods. For example, researchers have learned more about the way dogs think in the last decade than ever before. There are a number of unique attributes related to dogs that are of interest to dog trainers. These attributes are also of interest to the developers of training protocols and the manufacturers of pet training products and toys.

Researchers have developed "tests" to rate pet skills. Similar to an IQ test or a Myers-Briggs personality assessment, these tests provide insight into the inner workings of the dog's mind. It would seem reasonable to couple the test results with the development of personalized training protocols that lend themselves to optimized learning, thereby producing novel methods. Also, training product development teams may utilize this information to improve the development process.

As indicated above, each dog also has a certain intelligence. A dog's intelligence indicates an ability of an animal to learn a particular behavior or response. The higher the intelligence, the quicker an animal may learn the particular behavior or response. Intelligence type may suggest training methods and protocols, e.g. an owner may motivate/reward an extremely intelligent dog with treats that require the dog to determine a method/technique for extracting treats from an object.

As also indicated above, it is believed that each dog has a unique personality type. Efforts have been made to characterize personality types and to develop assessment tools for identifying the personality types. A personality assessment may identify different predominant behaviors and tendencies of an animal. For example, a dog may be predominantly sociable. Alternatively, a dog may be predominantly aggressive or predominantly submissive. One dog may enjoy (or at least tolerate) the sometimes abusive behavior of a small child, while another dog may shy away from such behavior or even react with hostility.

Differing personality types may suggest corresponding optimum training products. As just one example, a dog that exhibits a predominantly sociable disposition may respond to products that administer treats, pleasing sounds, positive reinforcements, etc. As another example, a shy dog may respond well to a dog training collar that dispenses a mild vibratory signal.

The dog's intelligence will also come into play. A dog with more developed cognitive skills may only need to receive one or two electrical stimuli to be trained to avoid certain behaviors in the future, e.g., barking when the doorbell rings, running (or digging) out of the yard, failing to stay near the owner during walks. Dogs with a lower level of intelligence may need multiple types of negative stimuli to train against negative behaviors. These may include stronger shocks, more frequent shocks, supersonic noises, shrill noises, high-Hertz vibrations, and so forth.

It is proposed herein to employ a dog's determined intelligence and/or a dog's determined personality type to identify an appropriate type of training device (or setting for a device) for an individual animal. It is further proposed herein to employ a dog's determined intelligence and/or a dog's determined personality type to identify an appropriate dog training protocol for that specific dog. Still further, it is proposed herein to employ a dog's determined intelligence and/or a dog's determined personality type to identify appropriate toys for entertaining or keeping the interest of the dog.

Under an embodiment herein, a dog owner or trainer may use testing assessments to select optimum combinations of training products and protocols. FIG. 1 shows a method 100 for training assessment and optimization. For the purpose of the example, assume that a skilled or certified trainer adopts such method 100 to develop and implement a training regimen for a dog. However, it should be noted that these procedures may also be adopted by an owner of a domesticated pet.

First, individual testing of a dog takes place. This is shown at Box 110. The trainer may perform the testing himself/herself, or may outsource the testing to a third party. Most preferably, the testing is conducted through the use of a guided series of inquiries offered by brochure or through on-line portal.

The testing 110 under one embodiment reveals an optimum learning style and areas of peak intelligence. In particular, the testing provides both intelligence testing and personality testing. The intelligence and personality assessments may comprise publicly available assessment tools, such as use of the Dognition™ protocol mentioned above and the use of tests such as the personality assessment shown in FIG. 3.

Step 110 comprises individual testing of the dog and subsequent review and evaluation of test data. As shown in FIG. 1, the test data will include both intelligence determination and personality assessment.

Box 116 schematically demonstrates a cognitive skill level assessment. The testing will identify a level of intelligence, depicted at $I_1, I_2, \ldots I_n$, wherein each of $I_1, I_2, \ldots I_n$ represents a scaled range of intelligence. In one aspect, the scaled ranges $I_1, I_2, \ldots I_n$ are weighted according to the breed of the dog as determined as part of the testing in Box 110. Cognitive skill may also be judged based upon the extent of previous dog training the animal has experienced, or simply from individual, objective testing. In one aspect, a dog of a particular breed who is considered to be at the lower range of cognitive skill and who has never undergone obedience training will be at the lowest end of the intelligence range, e.g., $I_1$. At the other end, a dog of a particular breed who is considered to be at the higher range of cognitive skill and who has undergone extensive obedience training will be at the highest end of the intelligence range, e.g., $I_n$. In another aspect, intelligence of the dog is derived solely from individual testing to yield objective results.

Also as part of the method 100, individual testing 110 will include a personality assessment. Box 118 schematically demonstrates a personality assessment. The testing will identify a personality type of the animal, depicted at $P_1, P_2, \ldots P_n$, wherein each of $P_1, P_2, \ldots P_n$ represents an assigned personality type. Personality types may be assigned, for example, as follows:

| | |
|---|---|
| $P_1$ | Active, playful and busy |
| $P_2$ | Stoic, clever, intense |
| $P_3$ | Loving, strongly attached, pushy |
| $P_4$ | Precise, bonded orderly |
| $P_5$ | Gallant, intense, driven |
| $P_6$ | Obedient, loyal, dependable |
| $P_7$ | Stubborn, strong |
| . . . | |
| $P_n$ | Devoted, sweet, kind |

In one aspect, the personality types $P_1, P_2, \ldots P_n$ are determined through mere observation and subjective evaluation by the pet owner or professional trainer. In another embodiment, the personality types $P_1, P_2, \ldots P_n$ are determined through formal testing conducted by the owner in response to questions or challenges presented to the owner (either through paper or through a web platform) and exercises given to the dog in response to the challenges. In still another aspect, the personality types $P_1, P_2, \ldots P_n$ are at least partially weighted based upon breed. In still another aspect, the personality types $P_1, P_2, \ldots P_n$ are determined through application of a personality matrix 300, such as that shown in FIG. 3.

In U.S. Patent Publ. No. 2011/0136086, a series of "cards" are employed. Each of the four cards can be characterized by a color and a corresponding graphic image on one side, and descriptive text upon the other side. The textual description presents an animal personality type. The accompanying textual description can expand upon the personality traits of the breed associated with, and thereafter designated by, that particular color.

In the arrangement of FIG. 3, a matrix 300 of personality types is provided to produce a color spectrum. In the "y" axis, characteristics 32, 34, 36, 38 and 40 are presented under each of colors orange, gold, blue and green. A numerical value is assigned to each characteristic, and then totaled at the bottom. Totals for each color are entered in boxes 54, 56, 58 and 60. The box 54, 56, 58, 60 with the highest score indicates a personality type for the animal. In the present invention, a similar matrix may be employed, with the results then being integrated into the assessment 116. Thus, for example, the following assignments may be made wherein the box with the highest score is listed first, and then in descending order:

| | |
|---|---|
| $P_1$ | Orange, gold, blue, green |
| $P_2$ | Gold, blue, green orange |
| $P_3$ | Blue, green, orange, gold |
| $P_4$ | Green, orange, gold, blue |
| $P_5$ | Orange, blue, green gold |
| $P_6$ | Blue, green, gold, orange |
| $P_7$ | Green, gold, orange, blue |
| . . . | |
| $P_n$ | Green, gold, blue, orange |

Thus, personality types in this assessment are based upon a color spectrum.

Of course, it is understood that the color options presented herein are merely illustrative, and other color systems or non-color systems for assigning personality types $P_1$, $P_2$, ... $P_n$ 118 may be used to create useful spectra.

Under one embodiment of the method 100, the trainer uses the determined personality type 118 to select corresponding optimum training products $PD_1$, $PD_2$, ... $PD_n$ for the dog. Training products are shown at 122. As one example, the personality testing may reveal that the dog has personality $P_1$. Under an embodiment, the personality $P_1$ suggests training product $PD_1$ as the optimal training tool for that particular dog. Similarly, personality $P_2$ suggests training product $PD_2$ is the optimal training tool for the particular dog.

It should be noted that the testing 110 may identify one personality type or a combination of such types. The identified personality type or types may indicate or suggest a single corresponding training product or a combination of training products.

As indicated above, the testing 100 also identifies levels of intelligence $I_1$, $I_2$, ... $I_n$ 116. Under one embodiment intelligence levels $I_1$, $I_2$, ... $I_n$ 116 represent an overall general ranking of the dog's intelligence. The trainer may then use an identified intelligence level $I_1$, $I_2$, ... $I_n$ to select one or more corresponding training protocols $PT_1$, $PT_2$, ... $PT_n$.

Under one embodiment of the method 100, intelligence level $I_1$ suggests training protocol $PT_1$ as the optimal training protocol for that particular dog. Similarly, intelligence level $I_2$ suggests training protocol $PT_2$ is the optimal training tool for the particular dog.

It should be understood that intelligence levels $I_1$, $I_2$, ... $I_n$ 116 may represent different co-existing areas of peak intelligence. Under this alternative embodiment, testing may identify two or more areas of peak intelligence which may then suggest the use of one or more corresponding training protocols $PT_1$, $PT_2$, ... $PT_n$. Under an alternative embodiment, intelligence level $I_1$ may suggest a combination of training protocols $PT_1$ and $PT_2$ as the optimal training protocols for a particular dog.

In still another embodiment of the method 100, the trainer uses a novel combination of both the identified intelligence 116 and the determined personality type 118 to select a corresponding optimum training protocol 120 or a corresponding optimum training product 122 for the dog. For example, a dog who is at the higher end $I_n$ of intelligence range 116 and who has a "Green, gold, orange, blue" $P_4$ personality profile may need training protocol $PT_2$ and developmental toy $PD_3$. A dog who is at a medium point $I_4$ of intelligence range 116 and who has a "Gold, blue, green orange" $P_2$ personality profile may need training protocol $PT_3$ and developmental toy $PD_1$. It is again observed that, for dogs, the cognitive skill level 116 may be somewhat tied to the dog's personality type 118. Thus, rather than using separate intelligence levels $I_1$, $I_2$, ... $I_n$ 116 and personality types $P_1$, $P_2$, ... $P_n$ 118, a single spectrum of dog type $T_1$, $T_2$, $T_3$, ... $T_n$ may be used to associate optimum training protocols $PT_1$, $PT_2$, ... $PT_n$ or optimum training products $PD_1$, $PD_2$, ... $PD_n$ for the dog. It should be noted that an embodiment of method 100 may be comprise use of personality type alone or intelligence level alone to select a training product and/or protocol.

In use, the method 100 described above may improve the training and learning experience of domesticated dogs (or other pets) by aligning the proper products and training protocols with their particular needs, abilities and breeding traits. Those with multiple pets have likely experienced the diversity in dog personality and intelligence. By utilizing research data and corresponding testing procedures, pet owners and trainers benefit by being guided as to what product and training protocol works best for a particular dog or type of dog. This approach saves, under one embodiment, time in training and money by avoiding the purchase of improper products. From the dog's point of view, this process streamlines the training process in the most efficient and humane way.

Figure 2:
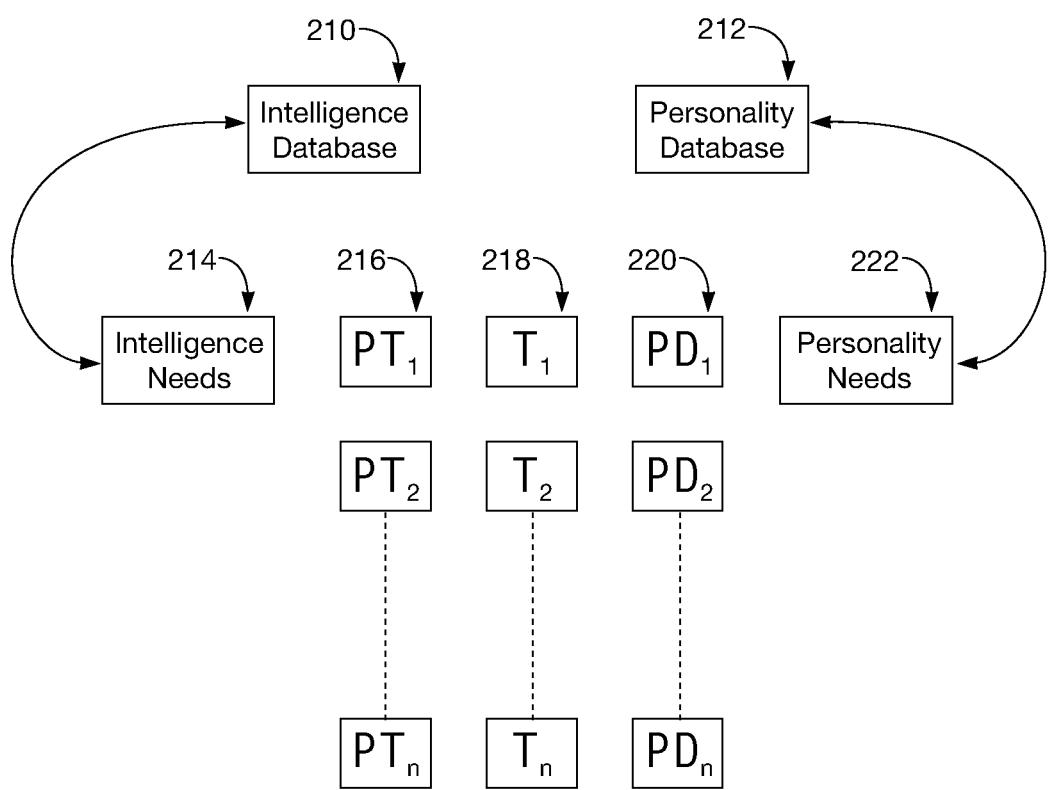
FIG. 2 shows a method for optimizing pet training products and training protocols, under an embodiment.

Researchers and trainers may use both personality and intelligence testing to build stereotypical personality and intelligence databases. FIG. 2 shows intelligence database 210 and personality database 212. Repeated intelligence testing across a population of dogs may generate database 210 suggesting certain intelligence needs 214, i.e. levels or types of intelligence that suggest certain optimal training protocols $PT_1$, $PT_2$, ... $PT_n$ 216. Likewise, repeated personality testing across a population of dogs may generate database 212 suggesting certain personality needs 222, i.e. types of personality that suggest certain optimal training products $PD_1$, $PD_2$, ... $PD_n$ 220.

As noted above, a combination of intelligence needs 214 and personality needs 222 may be used to suggest corresponding pet types $T_1$, $T_2$, ... $T_n$, indicated at 218. Experimental application of product/protocol combinations to pet types $T_1$, $T_2$, ... $T_n$ may under an embodiment optimize product/protocol selection on an individual pet basis. As seen in FIG. 2, pet types $T_1$, $T_2$, ... $T_n$ 218 correspond to product and protocol combinations. As just one example, a trainer may test a dog for intelligence and personality type. In comparing the results to intelligence and personality database results 210, 212, the trainer identifies the dog as type $T_2$, which may represent a specific combination of intelligence needs 214 and personality needs 222. The trainer may then select protocol $PT_2$ and product $PD_2$ for optimum training of the dog based on the test results. Note that protocol $PT_2$ may represent one or more combination of protocols and that product $PD_2$ may represent one or more products.

The concept of intelligence 210 and personality 212 databases may include finding statistical associations between personality type and training products and between intelligence level and training protocols. The identified relationships may comprise associations between outcomes, e.g. time to learn a particular response, and predictors such as personality type, intelligence type, age, dog breed, environmental conditions or some combination thereof.

A statistical study under one embodiment may aggregate dogs of similar characteristics and then separate the population into two or more different testing groups. For example, study administrators may screen or assess a large number of dogs using a personality assessment tool. The study may identify a population of dogs that all rank high in a particular personality trait/characteristic, e.g. sociability. The study may wish to identify an optimal training product for teaching an animal to stay at one location upon command. (Of course it is determined that the study dogs have yet to learn the target behavior). Under one embodiment, a study protocol assigns to one group a collar device that applies negative stimuli, e.g., electrical shocks or high-Hz vibrations, while another group is assigned a collar device that only applies positive stimuli, e.g. pleasing tones or scents. The training products are then consistently applied within each group.

Under this embodiment, time to learn the target behavior or response may comprise an outcome variable. In other words, study administrators apply the training products to each group and measure the time each dog takes to learn the response, e.g., to learn the "stay" behavior. The outcome variable may be a continuous variable (e.g. number of aggregate hours to learn response) or simply binary (e.g., success or failure). Statistical associations between each product type and outcome may be determined using statistical methods such as analysis of variance or categorical data analysis but embodiments are not so limited. Additional predictors may be used alongside product groupings in order to control for additional variables such as age or breed of the animal. It should also be noted that analogous tools and methods may be used to associate intelligence levels with optimal training protocols.

As another approach, a study may recruit a large number of dogs for a study. Under one embodiment, administrators may assess the personality type of each dog using personality assessment tools. Under this embodiment, administrators also assess intelligence using intelligence assessment tools. In this manner, the personality type and intelligence level of each dog is known. Accordingly, a study protocol may then investigate various combinations of product type, product protocol, personality type and intelligence level. As one example, a study may administer a single product type for teaching a particular behavior to the entire study population. Time to learn the behavior may be measured as an outcome variable. Statistical methods may then be used to analyze collected data and infer which personality type may be best suited to the particular product.

This application of the proposed study design is analogous to the experiment suggested above and may also be used to associate intelligence level with optimal training protocols. However, this study design facilitates more sophisticated analysis options. For example, this study design may be used to investigate product type/training protocol combinations administered to (i) personality types, (ii) intelligence levels, and (iii) personality/intelligence combinations. This approach allows identification of optimal product/protocol regimens for a composite personality/intelligence type.

Figure 4:
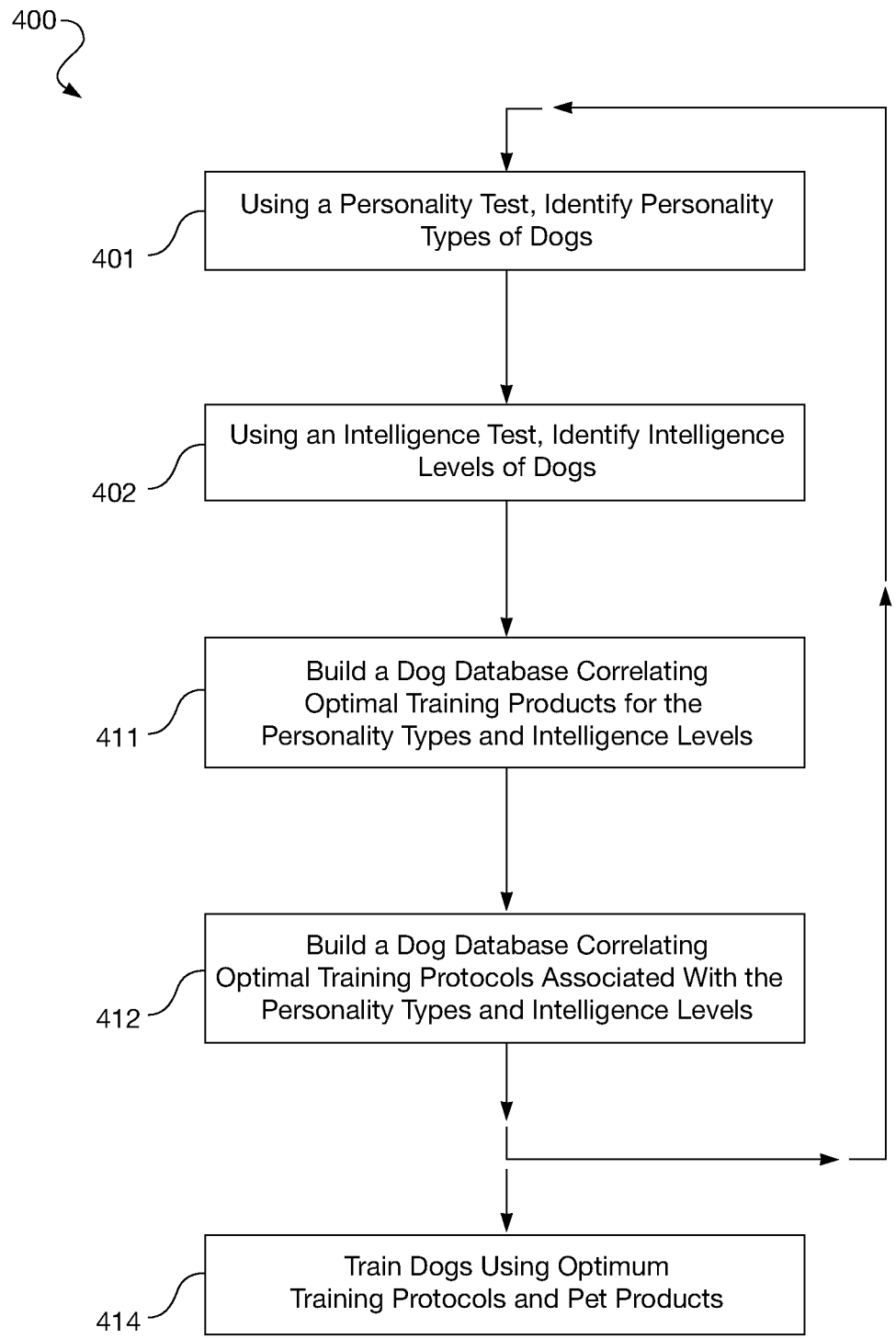
FIG. 4 is a flowchart showing a method of building two databases under an embodiment; a dog personality database of optimal training products for one or more of the personality types, and a dog intelligence database of optimal training protocols associated with one or more of the intelligence types, or levels.

Based upon the above, a method 400 of building personality and intelligence databases is provided. FIG. 4 is a flowchart showing a method 400 for building and using dog databases to correlate optimum training products (PDOT) and optimum training protocols (IDOT).

First, personality types of dogs are determined. This is shown in Box 401. The personality types are determined by using personality tests, or assessments. Information about breeding and living environments may be incorporated.

In addition, intelligence levels of dogs are determined. This is provided in Box 402. The intelligence levels are determined by using intelligence tests, or assessments. Information about breeding and levels of training may be incorporated.

Also as part of the method 400, a dog database is built that correlates optimum training products for the various personality types and intelligence levels, in combination. This is indicated at Box 411.

Also as part of the method 400, a dog database is built that correlates optimum training protocols for the various personality types and intelligence levels, in combination. This is indicated at Box 412.

The steps 401, 402, 411 and 412 are repeated as part of building accurate databases.

As an optional step, the method 400 of FIG. 4 also includes training dogs using the optimum training protocols and pet products. This is provided at Box 414.

Figure 5:
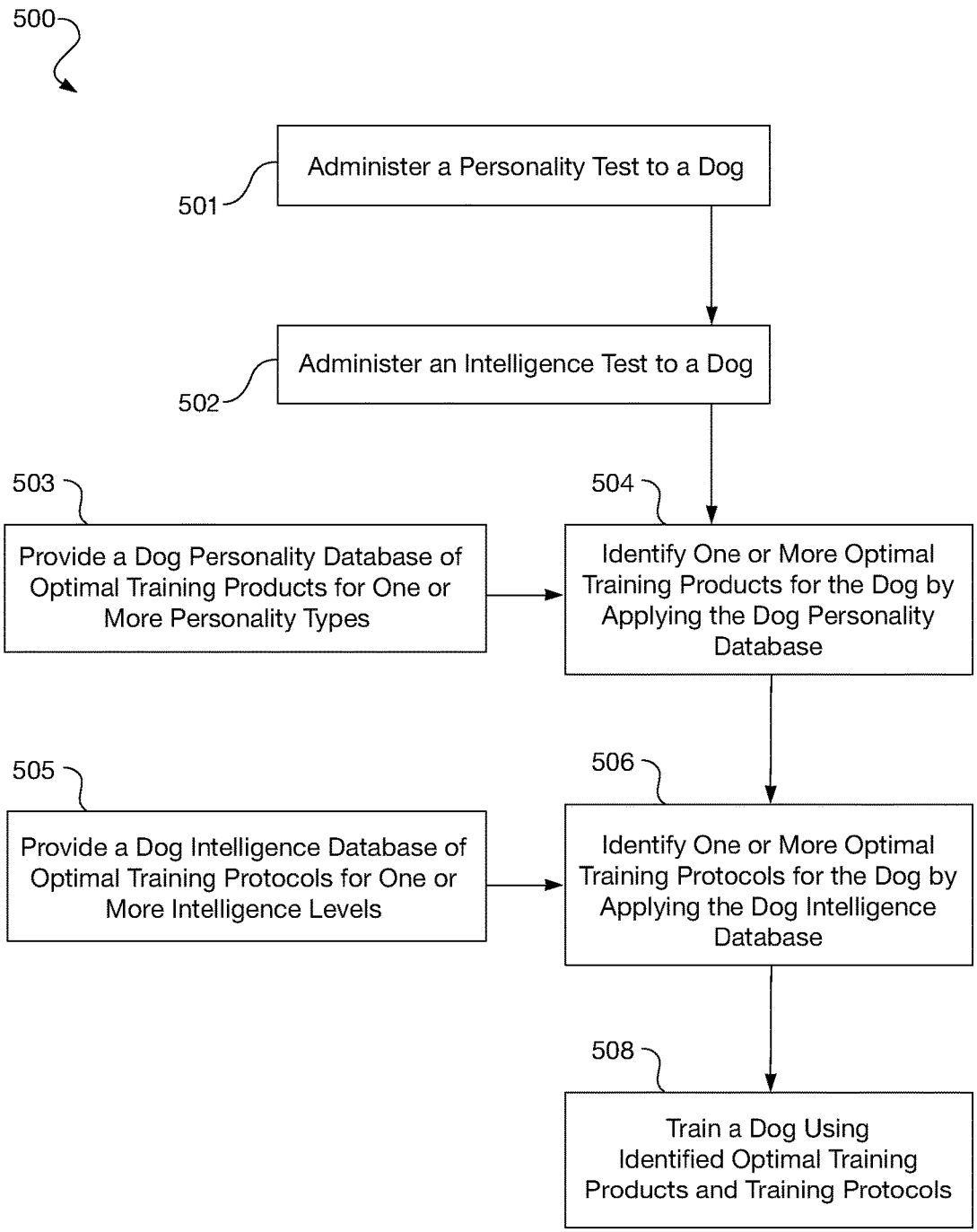
FIG. 5 is a flowchart showing a method of administering dog personality and intelligence tests coordinated with associated personality and intelligence databases, thus determining optimum training products and protocols for the dog, under an embodiment.

Also based upon the above, a method 500 is provided for selecting an optimal training product for a dog, or for selecting an optimal training protocol. FIG. 5 is a flowchart showing a method 500 for selecting optimal training products (PDOT) and optimal training protocols (IDOT) for a specific dog.

First, a personality test is administered to a dog. This is shown in Box 501. The personality test may be of any type, and may incorporate information about breeding, age and living environments.

In addition, an intelligence test is administered to the dog. This is provided in Box 502. The intelligence levels are determined by using intelligence tests, or assessments. Information about breeding and levels of training may be incorporated.

Next, a dog personality database is applied that correlates dog personality types with optimal training products. This is seen at Box 503. From this, one or more optimal training products is identified. This is indicated at Box 504.

In addition, a dog intelligence database is applied that correlates dog intelligence levels with optimal training protocols. This is seen at Box 505. From this, one or more optimal training protocols is identified. This is indicated at Box 506.

Preferably for the method 500, the databases of Boxes 503 and 505 are combined to generate the PDOT and IDOT of Boxes 504 and 506.

As an optional step, the method 500 of FIG. 5 also includes training dogs using the identified optimal training products and training protocols. This is provided at Box 508.

Additionally based upon the above, a method 600 is provided for testing a dog. The method 600 first includes testing a dog to determine a personality profile. This is seen at Box 601. Determining a personality profile 601 may include (i) observing the dog in connection with certain daily activities, (ii) empirically testing the dog by using exercises or commands, (iii) assessing breed type of the dog, (iv) determining a living environment of the dog, or (v) combinations thereof. The method 600 further includes testing the dog for determining a cognitive skill level. This is provided at Box 602. Determining a cognitive skill level 602 may include (i) assessing a breed type of the dog, (ii) identifying a degree of training through which the dog has been taken, (iii) empirically testing the dog by using exercises or commands, (iv) combinations thereof. In one aspect, the steps of Boxes 601 and 602 are merged into one test. For example, determining a cognitive skill level may include (v) determining a personality type, from a set of optional personality types, for the dog.

The method 600 also includes identifying an optimum training protocol for the dog. This is shown at Box 603. The method 600 additionally includes identifying an optimum pet toy for the dog (seen at Box 604), and identifying an optimum developmental product for the dog (seen at Box 605). The steps of Boxes 603, 604 and 605 are based upon the determined personality profile and intelligence range. Further determining combinations of 603, 604, and 605 is provided at Box 606 based upon the determined personality profile and intelligence range.

Figure 6:
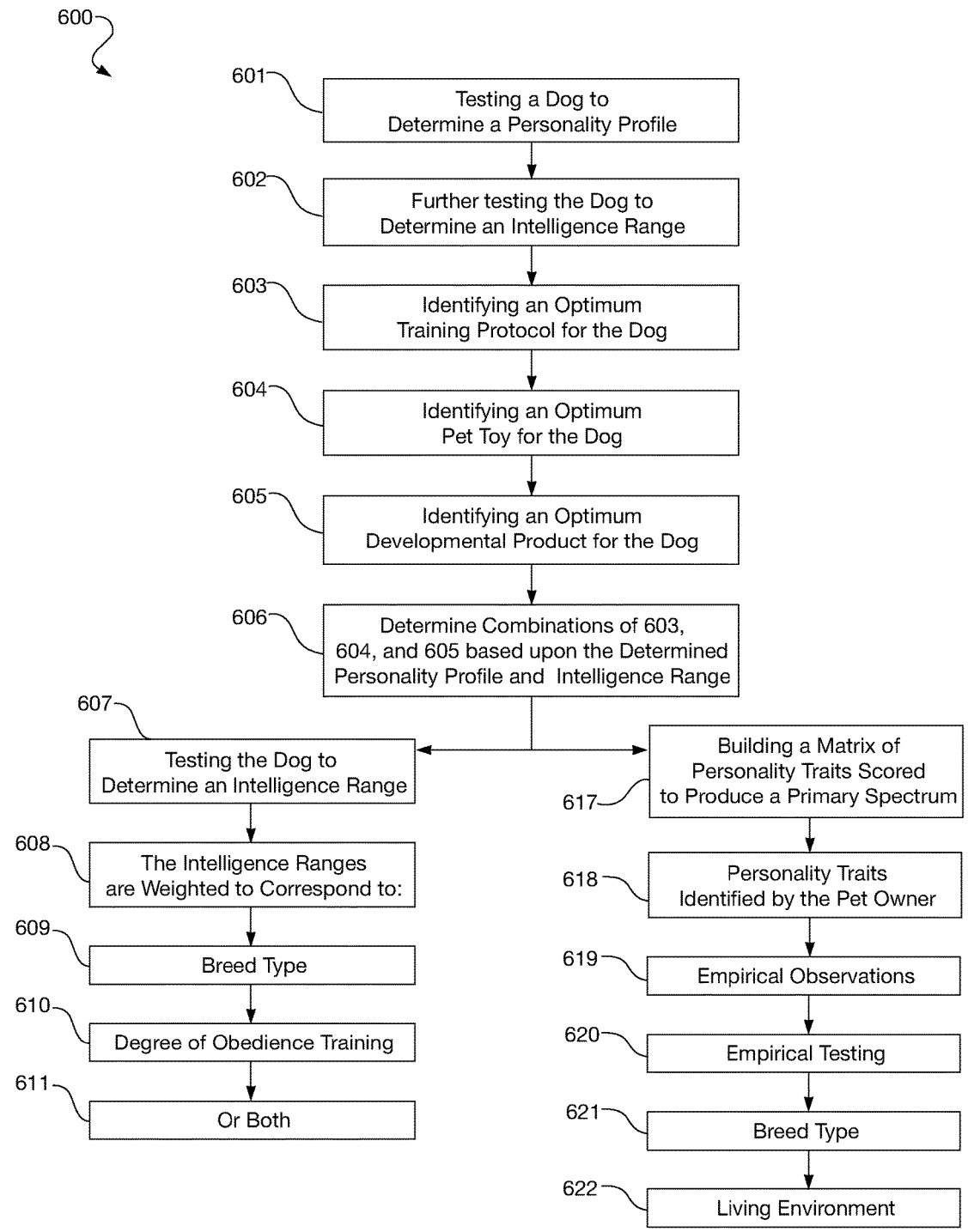
FIG. 6 is a flowchart showing a method of identifying combinations of optimum training protocol, pet toys, and developmental products based on personality profile and intelligence range, under an embodiment. Furthermore, the method is shown whereby intelligence ranges are determined based on testing and a matrix of personality traits, under an embodiment.

With continuing reference to FIG. 6, steps 607 for testing a dog to determine an intelligence range is shown wherein intelligence ranges are weighted 608 to correspond to breed type 609, degree of obedience training 610, or both 611. Furthermore, steps 617 for building a matrix of personality traits scored to produce a primary spectrum is shown wherein the personality traits are identified by the pet owner

618, along with empirical observations 619, empirical testing 620, breed type 621 and, optionally, living environment 622.

Figure 7:
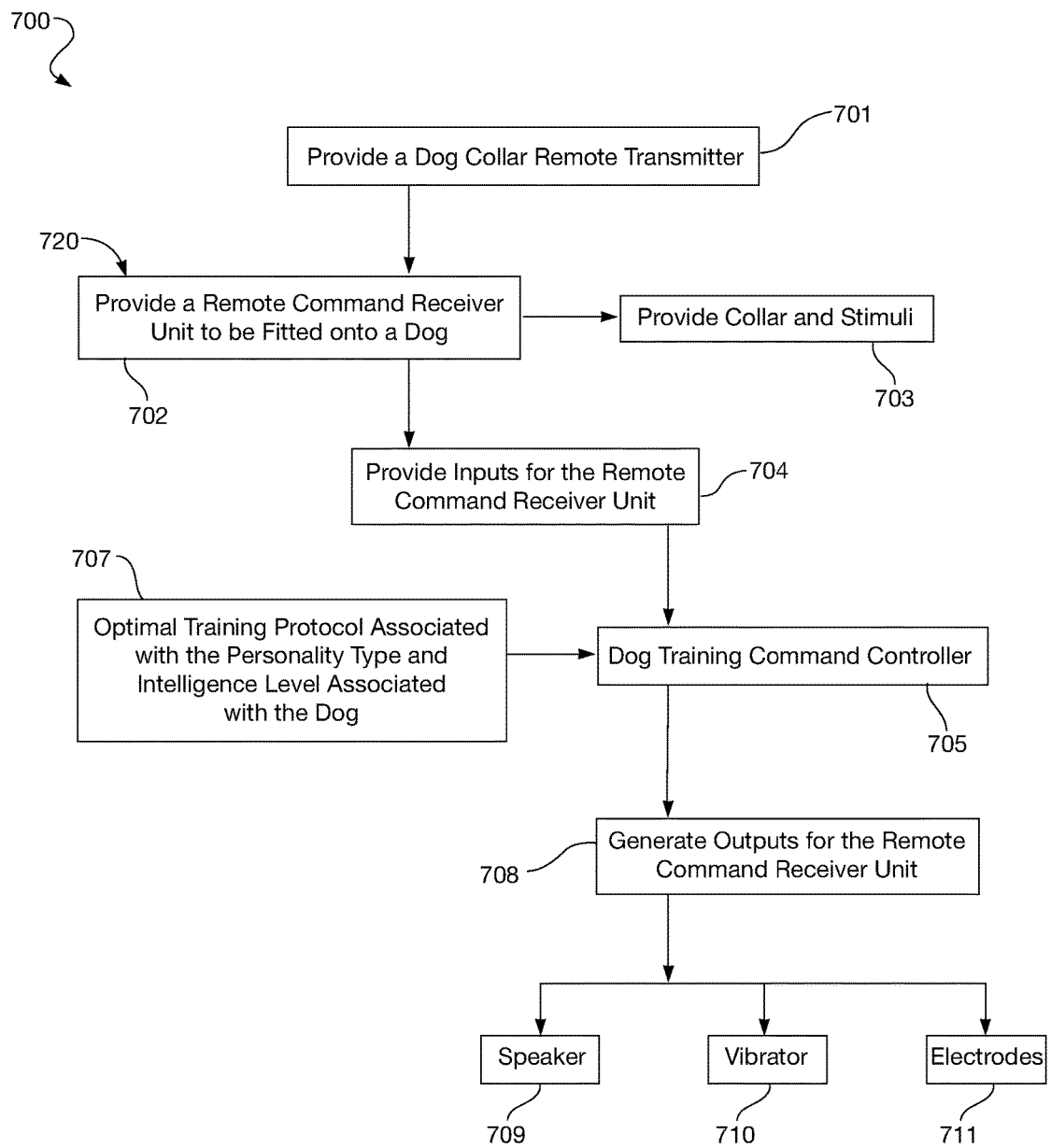
FIG. 7 is a diagram of a particular training and developmental product, a smart dog collar system, under an embodiment.

For some training goals such as keeping a dog within an "Invisible Fence"® area or for bark reduction, certain identified training protocols, preferably an optimal one, may be embedded in a dog collar or device to provide the ability to train the dog autonomously by the dog collar itself as well as through key commands from a remote dog collar transmitter or device. FIG. 7 presents a flowchart for a method 700 for operating, or for tuning, a dog collar training system for a canine. The system will include a dog collar remote transmitter and a remote command receiver unit. The remote command receiver unit will be supported on the dog by a collar or suitable harness, as desired.

The method 700 first includes providing a dog collar remote transmitter 701. This is shown at Box 701. The transmitter sends signals to a receiver unit via Bluetooth, IR, Zigbee or other wireless protocol.

The method 700 also includes providing a remote command receiver unit. This is seen at Box 702. The receiver unit is part of the dog collar training system 720, and receives signals from the dog collar remote transmitter 701.

The dog collar preferably includes a collar, and is configured with stimuli, as shown in Box 703. The remote command receiver unit is then fitted onto a dog.

The method 700 includes transmitting data commands, or signals, from the remote transmitter 701 to the remote command receiver 702. This is shown at Box 704. The transmitted data commands are received as inputs 704 to a dog training command controller, seen at Box 705.

The commands are processed by the dog training command controller 705. Various levels are sent through the outputs block 708 for actuation by a speaker 709, a vibrator 710, or a set of shocking electrodes 711, resulting in various stimuli to the dog. Some commands result in positive stimuli to the dog including a pleasing sound, a pleasing odor or a mild vibratory signal while some commands result in negative stimuli to the dog including harsh or loud sounds, intense vibrations, or a high level of electric shock.

With continuing reference to FIG. 7, the dog collar 720 may receive voice over data signals or audio at the remote command receiver 702 wherein voice commands from the dog trainer are passed through to the speaker 709 for reproduction into the dog's ears. The voice over data commands provide the dog trainer with the advantage of speaking to the dog at a low or normal sound level through the speaker 709 regardless of how far the dog has wandered. This eliminates the occasional need to yell at the dog due to distance and therefore reduces the irritation to others in hearing range of the training area. Further, this allows the dog trainer to whisper into the dog's ears and gives the appearance that the dog is behaving independently but is actually being commanded by the dog trainer.

With continuing reference to FIG. 7, some training goals associated with staying inside a hidden fence or barking reduction, the dog collar 720 may perform as the optimum development product 605 and receive commands to operate autonomously based on the dog training controller 705 using an optimal training protocol associated with the intelligence type of the subject dog 707. Alternately, autonomous operation of the dog collar 720 may include a series of increasing levels of various positive stimuli until a training goal is achieved. Further, autonomous operation of the dog collar 720 may include a series of increasing levels of various negative stimuli until a training goal is achieved. Furthermore, autonomous operation of the dog collar 720 may include a series of trial-and-error stimuli and measured responses.

A microphone in the dog collar 720 may sense barking or other dog sounds such as whining or whimpering. The dog training command controller 705 may sense or interpret the various dog sounds and vary the stimuli based on what the dog is saying in dog sounds. Further, the dog training command controller 705 may include a human speech recognition system whereby the dog trainer's verbal commands such as a pleasing low level vibration to the dog collar may be verbal as an alternative to key commands from the dog collar remote transmitter 701. The speaker 709 volume level is calibrated in decibels such that remote verbal commands coming from the speaker are set at approximately the same level as if the dog is standing nearby the dog trainer. For pleasant sounds in positive stimuli, the volume level is set at approximately the same level as verbal commands whereas the strong negative stimuli sounds are calibrated to be at a much higher level such as 80 db. Alternatively, speaker 709 or an auxiliary ultrasonic speaker may be capable of ultrasonic sound emissions and would be calibrated to just under a dog's threshold of pain for negative stimuli. Verbal commands may be stored digitally within the dog training command controller 705 for generating verbal commands such as "LEAVE IT" or "GOOD DOG." It is understood that the systems and methods of FIGS. 1 and 2 and FIG. 4 through 7 for training dogs are merely illustrative. Other arrangements may be employed in accordance the embodiments set forth below. Further, variations of the systems and methods described herein may comply with the spirit of the embodiments set forth herein.

Computer Simulation of Animal Training Scenarios and Environments

Dog behavior researchers continue to advance their understanding of a dog's mental disposition. Optimal dog training begins with an evaluation of the dog's personality and intelligence. This information informs a directed training approach based on the dog's mental character, i.e. personality type and intelligence level. As already described in great detail above, a combination of a dog's determined intelligence and personality type may be used to identify an appropriate type of training device or training product. Further, a combination of a dog's determined intelligence and personality type may be used to identify an appropriate dog training protocol for use with the training product or device.

However, even if the ideal training product and protocol are identified for a particular breed of dog (possessing a specific combination of personality and intelligence characteristics), a trainer may completely undermine the efficacy of the product/method through improper implementation. Many owners wish to train their dog (or other domesticated animals) to be well behaved citizens of the owner's home and property. However, owners often lack an understanding of dog behavior. Further they lack an understanding of pet responses to training techniques. This lack of understanding predisposes training efforts towards failure. Assuming the user is in possession of proper devices and may be generally aware of corresponding training methods, the user may still misdirect the training regimen. For example, an owner may inconsistently apply a correction. As another example, an owner may be too quick or too aggressive in applying a correction. As another example, an owner may provide a poor environment for the training session. Each of these errors (or a combination of such errors) may adversely affect an animal's ability to learn the target behavior.

Just as computers simulate the experience of flying as a key component of flight training, so too may computers simulate the experience of training an animal. Computer simulation offers at least four benefits over "live" training. First, computer simulation provides under one embodiment near real-time feedback. This feedback may confirm the efficacy of the process. Alternatively, feedback may refute the efficacy of the process suggesting adjustments to the training approach. Second, computer simulation may dramatically minimize ill effects that may result from training session errors. Third, the simulations may be run and rerun as needed to perfect the training experience. Fourth, mistakes are themselves part of the learning experience. If errors are committed and then avoided in simulated training sessions, the same errors may be completely avoided in live training scenarios.

Figure 8:
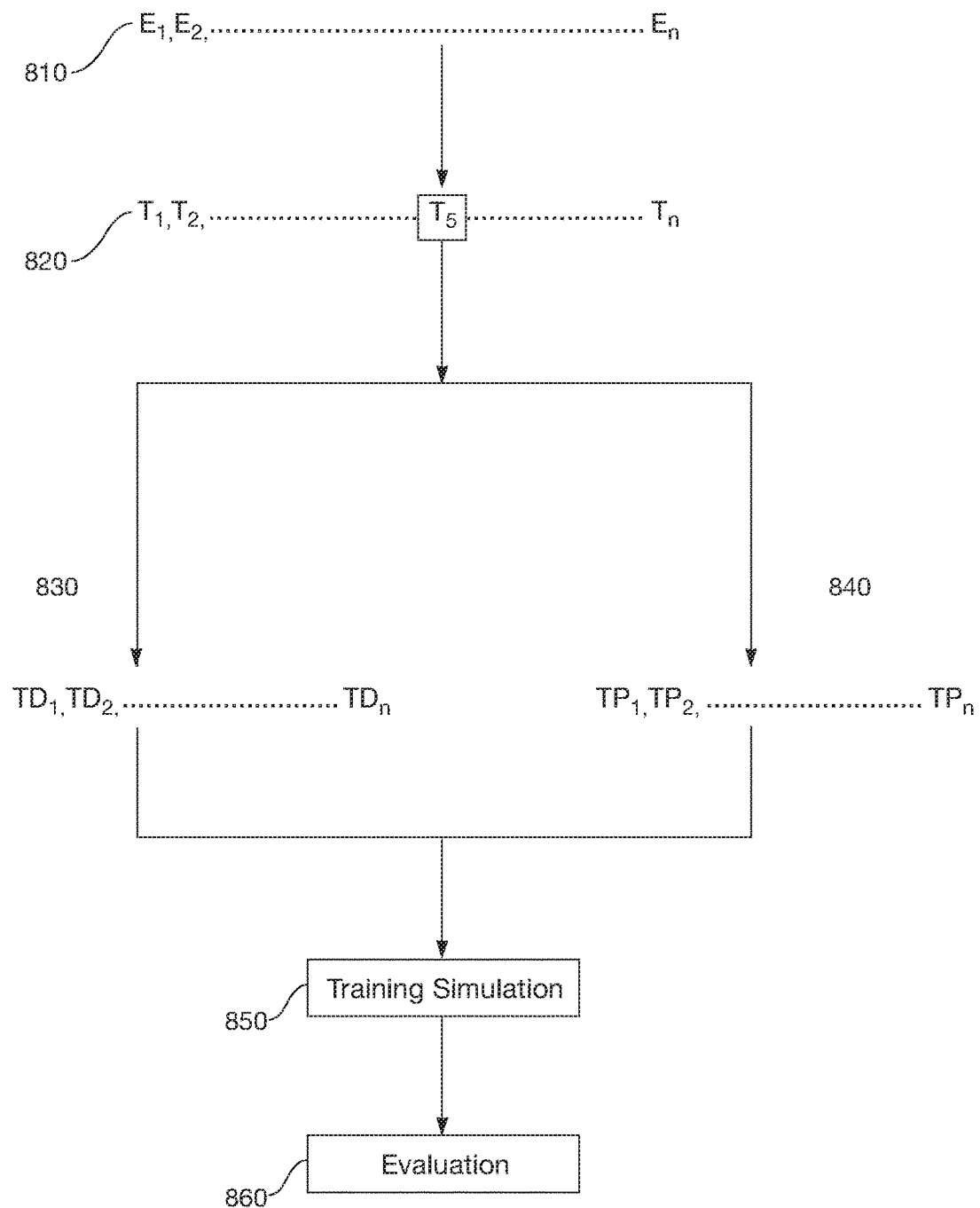
FIG. 8 is a flowchart showing a method of identifying combinations of optimum training products and protocols and providing a simulation of their use, under an embodiment.

FIG. 8 shows a method for identifying optimal training devices and methods for training a dog. In contrast to the methods described above, this method implements a simulated training session. Step 810 comprises testing an individual dog. The test may comprise one or more evaluations ($E_1$, $E_2$, $E_3$, . . . . $E_N$). Any single evaluation or any combination of evaluations may be used to determine a personality type and an intelligence level of the animal. Step 820 shows the identification of one or more combined personality/intelligence types ($T_1$, $T_2$, . . . $T_n$). based on the evaluation information. Under this embodiment, the evaluation information is used to identify personality/intelligence type $T_5$. Step 830 discloses a selection of training devices ($TD_1$, $TD_2$, . . . $TD_n$) based on the type $T_5$. A single training device or combination of training devices may be selected. Step 840 discloses a selection of training protocols ($TP_1$, $TP_2$, . . . $TP_n$) based on the type $T_5$. A single training protocol or combination of training protocols may be selected. It should be noted that this disclosed device/protocol identification corresponds to a desired behavior or target response. In other words, a first training goal, e.g. teaching a dog to sit, may correspond to a first set of devices and protocols identified by this method while a second training goal, e.g. teaching the same dog to stay, may correspond to a second set of devices and protocols identified by this method.

At step 850, an owner, i.e. trainer, of the animal is presented with a training simulation. The simulation actually simulates the experience of implementing the identified training regimen using the identified training device and protocol. The training is under an embodiment a computer simulation as described in greater detail below. Step 860 includes an evaluation and grading of the owner's participation in the simulation.

The computer simulation under one embodiment provides a virtual environment which replicates a training scenario. The simulation comprises an application which essentially gamifies the training environment. The simulation provides an owner with real time experience using a particular training method and provides real time feed back. The user is free to make errors during the simulation prior to real world efforts. Virtual training is particularly valuable when improper application of the particular training device/method may adversely affect the animal.

As one example of a virtual training scenario, assume that the method set forth in FIG. 8 identifies a remote training system (and corresponding positive/negative stimulus techniques) for teaching an animal to avoid certain elevated areas in a living environment, e.g. couches, chairs, beds, etc. Under this embodiment, the remote trainer comprises a collar device and a handheld device. Training collars may be activated by a handheld device. Higher quality remote trainers include a large variety of levels and functions, may provide varying types and durations of stimulation, and may include beep, vibration or scent options that are useful for commanding the dog's attention. Proper training is an imperative for remote collar use, as misuse can cause negative behavioral fallout.

Remote trainers may be used in conjunction with principles of operant conditioning. The remote trainer may introduce a negative stimulus at the moment an undesired behavior occurs, in order to reduce the frequency of that behavior. The remote trainer may provide a form of negative reinforcement under certain circumstances. For example, a continuous negative stimulus may be applied until the moment a desired behavior occurs, in order to increase the frequency of that behavior.

Many recommend consulting a behaviorist or a certified training professional who is experienced with remote for successful usage and application. Alternatively the remote training experience may by simulated as further described herein.

Continuing with the example set forth above, the method of FIG. 8 is used to evaluate a dog's personality and intelligence. This information is then used to identify an optimal training device and protocol. Under an embodiment, the user wishes to teach an animal to avoid certain elevated areas, e.g. couches, chairs, beds, etc., in a living space. The identified remote training system comprises a remote training device (operated by an owner/trainer) and collar worn by the animal. A corresponding training protocol comprises techniques for teaching an animal to avoid those elevated areas, e.g. couches, chairs, beds, etc. The optimal training protocol may comprise the introduction at least one stimulus at the moment certain behaviors occur. For example, the optimal training protocol comprises the introduction of a negative stimulus at the moment an undesired behavior occurs.

At step 850 of the method shown in FIG. 8, information of the dog's personality and intelligence, i.e. the dog's type, is provided to the computer simulation application. Further, information of the identified dog training device and training protocol (for achieving the underlying training objective) is also provided to the computer simulation application. The application runs on a desktop computer under an embodiment and creates a simulation environment for the owner/trainer. The simulation may replicate a training session using a game environment. For example, the owner may use some combination of mouse, keyboard, or game controller to control the movements and actions of an in game avatar who interacts with the environment to complete a training regimen.

Based on the training objective, the training device, and the training protocol, the application provides a virtual real time training session. First, the application provides an environment which itself is suitable for the training session. Given the training objective of preventing access to elevated areas, the application may present a living room setting featuring a couch and a coffee table. Under one embodiment, the application may occupy the initial living room setting with inappropriate distractions. For example, a living room stereo may play excessively loud music. Further, children may be at play on the couch. Finally there may be food on the coffee table. The overwhelming influx of stimuli may override an animal's attention to training stimulus. An owner may then be forced to manipulate the in game trainer avatar (i.e. the virtual representative of the owner/trainer) to "clean up" the environment before training proceeds.

The application may then populate the game with a representation of the owner's dog. The dog interacts with the environment just as the dog otherwise would in the real world. Of course, the real world dog will seek a favorite spot on the couch or throw front paws on the coffee table in search of treats. The virtual dog eventually mimics the unwanted behavior of the real world dog. The avatar is equipped with the in game handheld training device, and the "virtual" dog wears the "virtual" collar. The handheld device and the collar device function just like their real world counterparts and feature the same set of options and settings. As the virtual dog roams the living room setting, the owner/avatar may also move freely within the same environment. The owner avatar may also control the physical and environmental conditions of the setting. When the virtual dog jumps upon the couch, the owner/avatar (through manipulation of game control devices) manipulates the avatar's handheld device to administer a negative stimulus through the collar device. The in game graphics may confirm delivery of the stimulus through visible reaction or response by the animal or through other graphic indicators.

The owner/avatar may commit any number of mistakes in delivering the stimulus or otherwise in general operation of the virtual remote trainer. For example the owner may have delayed action too long such that the animal no longer associates the negative stimulus with the act of jumping upon the couch. For example, the owner/avatar may have applied the negative stimulus after the animal has already returned to the floor. The delayed action is confusing to the animal who may normally cruise the living room floor without incident. The owner/avatar may have applied a level and/or duration of stimulus too great for the particular dog's personality type and intelligence level.

The application may also provide animal responses that the average non-experienced trainer may fail to recognize. For example, when a dog is relaxed and comfortable, the dog may hold his ears naturally. When the dog is alert, the dog may raise them higher on his head and direct them toward whatever is holding his interest. A dog may also raise his ears up and forward when the dog is feeling aggressive. If a dog has his ears pulled back slightly, he may be signaling his intention to be friendly. If the dog's ears are completely flattened or stuck out to the sides of his head, the dog may be signaling a frightened or submission state. This application may teach the owner the appropriate action to take given a particular response. An example could be that after 15 minutes of simulated training, the dog avatar may start yawning, e.g. a sign that he is getting over stimulated and needs a break from the session. If the owner persists despite the sign then the application may provide the user with appropriate feedback.

With respect to the example provided above, the owner uses a combination of keyboard, mouse, and/or other peripheral controller to maneuver through and interact with a virtual on-screen environment. Under an alternative embodiment, the owner may integrate actual use of physical training devices into the simulation experience. Again with reference to the example above, the owner/avatar manipulates a virtual remote training system. The "in game" avatar possesses the handheld transmitter while the virtual animal wears the corresponding collar. The owner manipulates peripheral devices in controlling transmitter/collar functionality. Under one embodiment, the owner may directly connect a handheld training device, i.e. a handheld transmitter, and a collar device to the computing device running the simulation application. The connection may comprises a wired or wireless communication link. Both the transmitter and collar may send data to and receive data from the application. Under one embodiment the application may present set up and device configuration walkthroughs while the user follows along by physically manipulating the devices. The application may inform the owner of proper or improper device configurations and/or settings. Further, the owner may use one or more of these physical devices to interact with virtual training simulations. Again with reference to our example, a virtual dog runs about a physical training environment, i.e. the living room. If the dog hops up on the couch, the owner may use the actual physical transmitter to issue a correction. The application passes data of the correction to the virtual collar which may then confirm the command through audible or visual cues. Of course, the virtual dog may then respond by hopping back down to the floor.

The application may support voice recognition through one or more audio peripherals connected or coupled to the desktop computer. Under this embodiment, the application may correct an owner's verbal miscues during a simulation environment. As described above, the virtual owner may apply a negative stimulus (via virtual collar device) to an animal at the moment the animal jumps up onto a couch. Assume that the animal immediately jumps down from the couch while the owner remains silent. The application may instruct the user of an error, i.e. of a failure to verbally praise the animal and therefore reinforce the proper behavior. Likewise the application may warn against aggressive verbal corrections as needed.

As indicated above, a user may evaluate a dog to determine its personality type and intelligence level. The identified personality type and intelligence level may correspond to an ideal training product and training protocol for teaching a dog a particular behavior. The owner may then use this information to shop for training kits using computerized catalogues that identify and recommend training products based on dog specific personality and intelligence characteristics.

As one example, a pet owner may access an electronically delivered pet product inventory which customizes pet products to the specific attributes of the owner's dog. An electronic interface may guide the pet owner through a series of questions. The user may first be asked to identify the animal's breed along with additional data such as gender, age, known physical conditions, etc. The user may then be asked to identify the animal's personality type and intelligence level (determined under prior assessments). The interface may provide drop down menus featuring the array of personality and intelligence types corresponding to the particular tests used to evaluate the animal. With respect to this example, both the actual dog evaluation/assessment data and the electronic interface are keyed to a common set of evaluation protocols. Under alternative embodiments, the interface may prompt the user to identify the evaluation method to test the dog's personality and then prompt the user to identify personality type from a list of corresponding results. The interface may initiate a similar procedure to obtain intelligence level data. As a final input under an embodiment, the user may be asked to specify a training objective.

Given a training objective and information regarding the dog's breed, personality type and intelligence level, an application of the electronic catalogue service may process the data and present the user with optical training product/protocol recommendations. The catalogue may also recommend computer simulation products that train the user how to use the product in a virtual environment. Further, the electronic catalogue may present the training products as part of an overall kit including a combination of products, training manuals and training simulation materials.

Assume that a user wishes to teach an animal to respect certain spaces within a home, e.g. to avoid couches. The user may provide the electronic catalogue with the training objective and the information relating to the dog's particular characteristics. The use may then purchase a recommended training kit that includes the materials required to train the animal. The kit may ship with a remote training product (i.e. a handheld device that communicates with and controls operation of a training collar worn by an animal). The kit may ship with a training manual that teaches the owner the optimal method for using the remote training product. Further, the kit may ship with software for use on the owner's home computer. The software comprises under one embodiment an application for simulating training scenarios. As already described in great detail above, the computer simulation trains the user how to use a remote trainer in a virtual environment. The simulation not only provides virtual training scenarios but may also teach the user to configure the training devices themselves. For example, the simulation may provide a virtual configuration environment or rather may present the user with virtual representations of the training devices. The simulation may then walk the user through set up of the devices and configuration of various device parameters and operational settings. As indicated above, the application may also allow the user to connect physical devices to the computer, e.g. a handheld transmitter and collar of a remote training system. The application may then receive and respond to data provided through manipulation of such devices as already described above.

An application running on a mobile computing device such as a smartphone may provide a pet owner with opportunities to simulate use of a product in a field test environment. The smartphone application may simply run a simulation application as already described above. However, the smartphone application runs within a mobile device operating environment. The simulation application may leverage the mobile capabilities of the smartphone device to provide "field test" type training simulations. An example is provided below with respect to containment systems.

Certain pet training products introduce unique training challenges. Assume that an owner wishes to purchase a containment system (otherwise referred to as a pet fence or fenceless boundary). A pet fence or fenceless boundary is an electronic system designed to keep a pet or other domestic animal within a set of predefined boundaries without the use of a physical barrier. The pet wears a lightweight collar which emits a warning sound when the pet nears the boundary. If the warning is ignored and the pet crosses beyond the boundary of the fence, the pet receives a tone followed by a mild negative stimulus from the collar. A fenceless boundary may comprise an indoor or outdoor containment area. This example assumes an outdoor embodiment of a fenceless boundary.

Successful use of a pet fence involves an acclimation period during which the owner systematically introduces the pet to the containment area. The application process comprises repeated exposure of the animal to the presence and location of an hidden boundary (usually marked initially with flags) together with a combination of appropriate reinforcement stimuli to discourage traversal of the boundary. This acclimation process involves substantial time and commitment from the owner and requires a methodical and consistent approach. In a conventional scenario, an owner must forego any prior simulation training. Under this embodiment, the owner places a pet fence collar on the dog. Initially, the owner may also place an additional (conventional) collar on the dog to provide independent control of the animal for training purposes. The owner may then walk the animal towards boundary flags which mark the perimeter of the containment area. The hidden fence (e.g. a boundary coil or other perimeter equipment) detects the collar which then beeps. The owner then encourages the animal (via leash if necessary) to move away from the boundary flag and back into the containment area.

If the owner is inexperienced, the owner may commit errors during the acclimation process. The errors may undermine the success of the fenceless boundary training. A smartphone running a training application (corresponding to the containment system) may enable a field test simulation exercise that requires initial participation by the owner alone. Under this simulation embodiment, boundary flags are placed to visually mark the containment area. The boundary flags may themselves include transmitting beacons, e.g. Bluetooth low energy beacons. The smartphone application runs within a mobile device operating system that natively supports communications with Bluetooth low energy beacons. Each beacon (corresponding to a boundary flag) periodically broadcasts a unique identification number. During a set up process, the smartphone application may learn the identification number of each beacon. In a simulation exercise, the application may instruct the owner to approach a particular boundary flag. As the owner approaches the flag, the application detects the identification number of the flag beacon and estimates a distance from the flag. The application sounds an alert when the owner/trainer is in the appropriate position, i.e. in a position that will be appropriate when the owner later duplicates the action with the owner's pet. The alert may mimic the sound that the pet collar may issue during actual training. The application may verbally inform the owner that the system collar (worn by the animal) will issue a similar alert. When the owner has maintained the position for an appropriate amount of time, the application instructs the owner to retreat from the flag and enter the general containment area. The application may provide verbal instructions to assist the owner's future training efforts. For example, when the owner retreats from the boundary flag, the application may instruct the user to praise the animal in order to reinforce the desired behavior.

The smartphone application described above may collect physiological data during simulated and real world training sessions. For example, an owner/trainer may wear one or more of heart rate sensor for monitoring heart rate, an Electrocardiogram to monitor a heart's electrical activity (EKG or ECG), blood pressure sensors to monitor blood pressure levels, respiration rate sensors for monitoring respiration rates, temperature sensors for monitoring body temperature, and an accelerometer and/or gyroscope in order to monitor activity levels and activity types. Of course, the collar worn by the animal during real world training sessions may include a similar set of sensors. These sensors may be communicatively coupled with the smartphone application which receives and processes such data during simulation and real world training sessions. The application may then be able to detect elevated stress and/or anxiety of a user and/or animal during training sessions. The application may then use this information to direct a course of action by the owner to alleviate these identified stress/anxiety conditions. Note that physical sensors may also be used to monitor an owner's physiological state when engaged with the virtual desktop simulation environment described above.

In each of the simulation environments described above, the simulation application (desktop, smartphone, etc.) may collect training data. For example, the application may collect data regarding owner responses to application instructions and/or corrections. The application may also collect physiological data of owner and/or animal during virtual and/or real world training sessions. The application may then assess the success and/or failure of simulation training exercises. Such information may be used to suggest modification of simulation environments.

Figure 9:
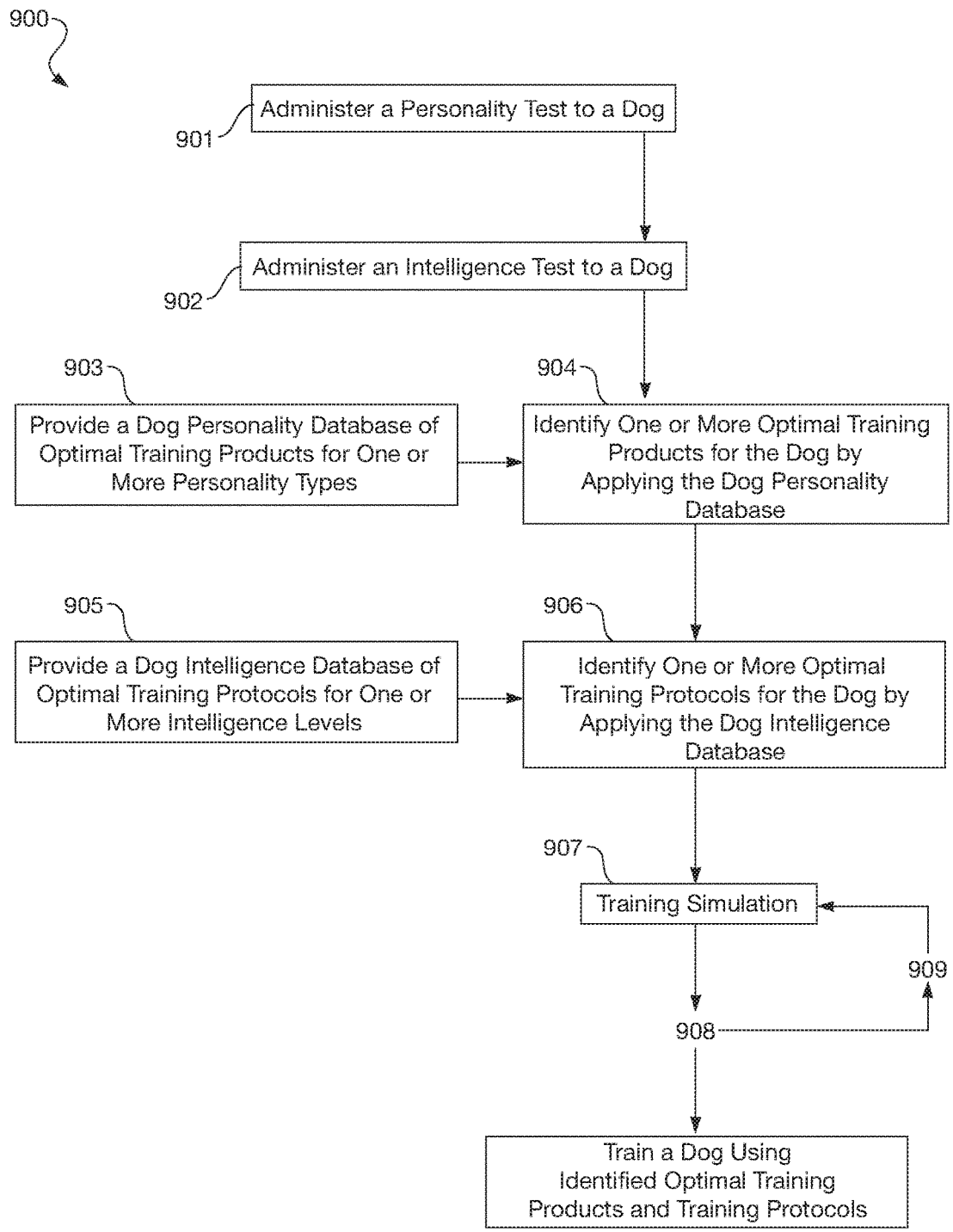
FIG. 9 is a flowchart showing a method of identifying combinations of optimum training products and protocols and providing a simulation of their use, under an embodiment.

FIG. 9 shows another method 900 for selecting an optimal training product for a dog and/or for selecting an optimal training protocol. FIG. 9 is a flowchart showing a method 900 for selecting optimal training products (PDOT) and optimal training protocols (IDOT) for a specific dog.

First, a personality test is administered to a dog. This is shown in Box 901. The personality test may be of any type, and may incorporate information about breeding, age and living environments.

In addition, an intelligence test is administered to the dog. This is provided in Box 902. The intelligence levels are determined by using intelligence tests, or assessments. Information about breeding and levels of training may be incorporated.

Next, a dog personality database is applied that correlates dog personality types with optimal training products. This is seen at Box 903. From this, one or more optimal training products is identified. This is indicated at Box 904.

In addition, a dog intelligence database is applied that correlates dog intelligence levels with optimal training protocols. This is seen at Box 905. From this, one or more optimal training protocols is identified. This is indicated at Box 906.

Preferably for the method 900, the databases of Boxes 903 and 905 are combined to generate the PDOT and IDOT of Boxes 904 and 906.

The method of FIG. 9 then provides a training simulation at Box 907 for training an owner of the dog in proper use of the optimal training products (PDOT) and optimal training protocols (IDOT). Upon successful completion 908 of the simulated training session, step 910 comprise training the dog using the identified optimal training products and training protocols. If simulated training session is not successfully completed 909, then the simulation training session is repeated.

Figure 10:
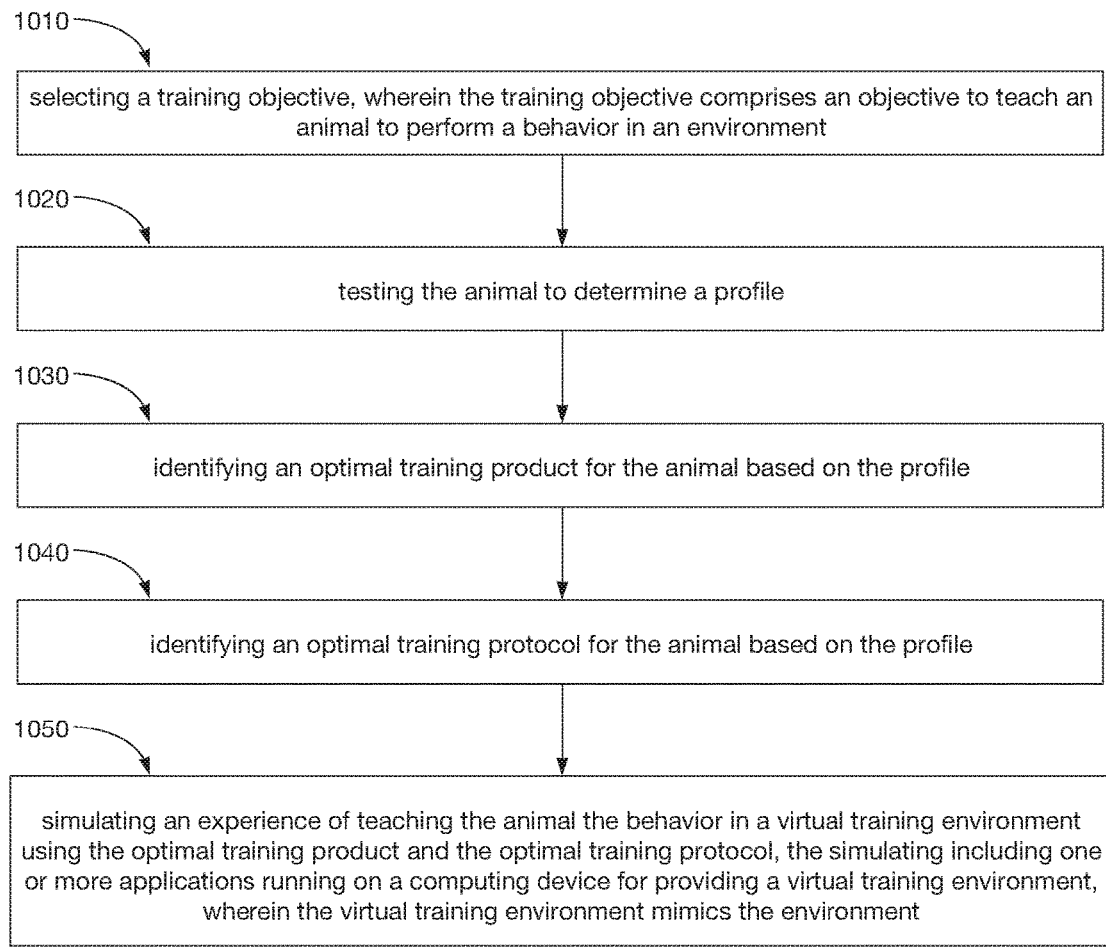
FIG. 10 shows a method for using a computing environment to simulate the experience of training an animal, under an embodiment.

FIG. 10 shows a method for using a computing environment to simulate the experience of training an animal. The method comprises 1010 selecting a training objective, wherein the training objective comprises an objective to teach an animal to perform a behavior in an environment. The method comprises 1020 testing the animal to determine a profile. The method comprises 1030 identifying an optimal training product for the animal based on the profile. The method comprises 1040 identifying an optimal training protocol for the animal based on the profile. The method comprises 1050 simulating an experience of teaching the animal the behavior in a virtual training environment using the optimal training product and the optimal training protocol, the simulating including one or more applications running on a computing device for providing a virtual training environment, wherein the virtual training environment mimics the environment.

A method comprises under an embodiment selecting a training objective, wherein the training objective comprises an objective to teach an animal to perform a behavior in an environment. The method includes testing the animal to determine a profile. The method includes identifying an optimal training product for the animal based on the profile. The method includes identifying an optimal training protocol for the animal based on the profile. The method includes simulating an experience of teaching the animal the behavior in a virtual training environment using the optimal training product and the optimal training protocol, the simulating including one or more applications running on a computing device for providing a virtual training environment, wherein the virtual training environment mimics the environment.

The animal is under an embodiment a dog.

The performing the behavior comprises under an embodiment the animal's avoidance of at least one negative behavior.

The at least one negative behavior comprises under an embodiment jumping upon at least one elevated area.

The at least one elevated area comprises under an embodiment one or more of a bed, a couch, a counter and a table.

The at least one negative behavior comprises under an embodiment jumping upon one or more individuals within the environment.

The at least one negative behavior comprises under an embodiment barking at the presence of one or more individuals at an entrance to the environment.

The at least one negative behavior under an embodiment comprises opening one or more trash receptacles in the environment.

The performing the behavior comprises under an embodiment the animal's performance of at least one positive behavior.

The at least one positive behavior comprises under an embodiment compliance with a sit command.

The at least one positive behavior comprises under an embodiment compliance with a heel command.

The at least one positive behavior comprises under an embodiment movement to a location within the environment in response to a command.

The optimal training product comprises under an embodiment a first device and a second device.

Under an embodiment, the first device wirelessly communicates with the second device, wherein the first device transmits control signals to the second device to control delivery of at least one stimulus to the animal.

The controlling the delivery includes under an embodiment ceasing the delivery of the at least one stimulus.

A trainer of the animal controls the first device under an embodiment.

The animal wears the second device under an embodiment.

The first device comprises under an embodiment a handheld transceiver and the second device comprises under an embodiment a remote collar.

The at least one stimulus comprises under an embodiment a negative stimulus.

The at least one stimulus comprises under an embodiment a positive stimulus.

The virtual training environment rendered by the one or more applications comprises under an embodiment a virtual representation of a trainer, a first virtual device and a second virtual device.

The first virtual device mimics under an embodiment the functionality of the first device.

The second virtual device mimics under an embodiment the functionality of the second device.

A virtual animal moves under an embodiment about the virtual training environment to mirror real world behavior of the animal, wherein the virtual animal wears the second virtual device.

The virtual representation of a trainer in the virtual environment carries under an embodiment the first virtual device.

The simulating includes under an embodiment manipulating the virtual representation of the owner, functionality of the first virtual device and functionality of the second virtual device through at least one peripheral device coupled to the computing device.

The at least one peripheral device includes under an embodiment voice recognition capability.

The simulating includes detecting under an embodiment at least one error in the manipulating the virtual representation of the owner, functionality of the first virtual device and functionality of the second virtual device through at least one peripheral device coupled to the computing device, the detecting the at least one error in the manipulating including evaluating the manipulating in accordance with the optimal training protocol.

The detecting the at least one error includes under an embodiment providing information for avoiding the at least one error.

The detecting the at least one error includes under an embodiment generating a score based on an occurrence rate of the at least one error.

The virtual animal performs under an embodiment the at least one negative behavior.

The simulating includes under an embodiment using the at least one peripheral device to administer the at least one stimulus.

The simulating includes under an embodiment issuing a virtual command to perform the at least one positive behavior using the at least one peripheral device and administering the at least one stimulus.

The simulating includes under an embodiment ceasing administering the at least one stimulus upon the performing the at least one positive behavior.

The virtual command comprises under an embodiment a verbal command.

Computer networks suitable for use with the embodiments described herein include local area networks (LAN), wide area networks (WAN), Internet, or other connection services and network variations such as the world wide web, the public internet, a private internet, a private computer network, a public network, a mobile network, a cellular network, a value-added network, and the like. Computing devices coupled or connected to the network may be any microprocessor controlled device that permits access to the network, including terminal devices, such as personal computers, workstations, servers, mini computers, main-frame computers, laptop computers, mobile computers, palm top computers, hand held computers, mobile phones, TV set-top boxes, or combinations thereof. The computer network may include one of more LANs, WANs, Internets, and computers. The computers may serve as servers, clients, or a combination thereof.

The systems and methods for identifying optimal training products and protocols and for providing training simulation environments can be a component of a single system, multiple systems, and/or geographically separate systems. The systems and methods for identifying optimal training products and protocols and for providing training simulation environments can also be a subcomponent or subsystem of a single system, multiple systems, and/or geographically separate systems. The components can be coupled to one or more other components (not shown) of a host system or a system coupled to the host system.

One or more components of the systems and methods for identifying optimal training products and protocols and for providing training simulation environments and/or a corresponding interface, system or application to which the systems and methods for identifying optimal training products and protocols and for providing training simulation environments is coupled or connected includes and/or runs under and/or in association with a processing system. The processing system includes any collection of processor-based devices or computing devices operating together, or components of processing systems or devices, as is known in the art. For example, the processing system can include one or more of a portable computer, portable communication device operating in a communication network, and/or a network server. The portable computer can be any of a number and/or combination of devices selected from among personal computers, personal digital assistants, portable computing devices, and portable communication devices, but is not so limited. The processing system can include components within a larger computer system.

The processing system of an embodiment includes at least one processor and at least one memory device or subsystem. The processing system can also include or be coupled to at least one database. The term "processor" as generally used herein refers to any logic processing unit, such as one or more central processing units (CPUs), digital signal processors (DSPs), application-specific integrated circuits (ASIC), etc. The processor and memory can be monolithically integrated onto a single chip, distributed among a number of chips or components, and/or provided by some combination of algorithms. The methods described herein can be implemented in one or more of software algorithm(s), programs, firmware, hardware, components, circuitry, in any combination.

The components of any system that include the systems and methods for identifying optimal training products and protocols and for providing training simulation environments can be located together or in separate locations. Communication paths couple the components and include any medium for communicating or transferring files among the components. The communication paths include wireless connections, wired connections, and hybrid wireless/wired connections. The communication paths also include couplings or connections to networks including local area networks (LANs), metropolitan area networks (MANs), wide area networks (WANs), proprietary networks, interoffice or backend networks, and the Internet. Furthermore, the communication paths include removable fixed mediums like floppy disks, hard disk drives, and CD-ROM disks, as well as flash RAM, Universal Serial Bus (USB) connections, RS-232 connections, telephone lines, buses, and electronic mail messages.

Aspects of the systems and methods for identifying optimal training products and protocols and for providing training simulation environments and corresponding systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the systems and methods for identifying optimal training products and protocols and for providing training simulation environments and corresponding systems and methods include: microcontrollers with memory (such as electronically erasable programmable read only memory (EEPROM)), embedded microprocessors, firmware, software, etc. Furthermore, aspects of the systems and methods for identifying optimal training products and protocols and for providing training simulation environments and corresponding systems and methods may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that any system, method, and/or other components disclosed herein may be described using computer aided design tools and expressed (or represented), as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described components may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments of the systems and methods for identifying optimal training products and protocols and for providing training simulation environments and corresponding systems and methods is not intended to be exhaustive or to limit the systems and methods to the precise forms disclosed. While specific embodiments of, and examples for, the systems and methods for identifying optimal training products and protocols and for providing training simulation environments and corresponding systems and methods are described herein for illustrative purposes, various equivalent modifications are possible within the scope of the systems and methods, as those skilled in the relevant art will recognize. The teachings of the systems and methods for identifying optimal training products and protocols and for providing training simulation environments and corresponding systems and methods provided herein can be applied to other systems and methods, not only for the systems and methods described above.

The elements and acts of the various embodiments described above can be combined to provide further embodiments. These and other changes can be made to the systems and methods for identifying optimal training products and protocols and for providing training simulation environments and corresponding systems and methods in light of the above detailed description.

We claim:

1. A method comprising,
selecting a training objective, wherein the training objective comprises an objective to teach an animal to perform a behavior in an environment;
testing the animal to determine a profile;
identifying an optimal training product for the animal based on the profile;
identifying an optimal training protocol for the animal based on the profile;
simulating an experience of teaching the animal the behavior in a virtual training environment using the optimal training product and the optimal training protocol, the simulating including one or more applications running on a computing device for providing the virtual training environment, wherein the virtual training environment mimics the environment, wherein the optimal training product comprises a first device and a second device, wherein the first device wirelessly communicates with the second device, wherein the first device transmits control signals to the second device to control delivery of at least one stimulus to the animal, wherein the virtual training environment rendered by the one or more applications comprises a virtual representation of a trainer, a first virtual device representing the first device, and a second virtual device representing the second device.

2. The method of claim 1, wherein the animal is a dog.

3. The method of claim 1, wherein the performing the behavior comprises the animal's avoidance of at least one negative behavior.

4. The method of claim 3, wherein the at least one negative behavior comprises jumping upon at least one elevated area.

5. The method of claim 4, wherein the at least one elevated area comprises one or more of a bed, a couch, a counter and a table.

6. The method of claim 3, wherein the at least one negative behavior comprises jumping upon one or more individuals within the environment.

7. The method of claim 3, wherein the at least one negative behavior comprises barking at the presence of one or more individuals at an entrance to the environment.

8. The method of claim 3, wherein the at least one negative behavior comprises opening one or more trash receptacles in the environment.

9. The method of claim 3, wherein the performing the behavior comprises the animal's performance of at least one positive behavior.

10. The method of claim 9, wherein the at least one positive behavior comprises compliance with a sit command.

11. The method of claim 9, wherein the at least one positive behavior comprises compliance with a heel command.

12. The method of claim 9, wherein the at least one positive behavior comprises movement to a location within the environment in response to a command.

13. The method of claim 1, the controlling the delivery including ceasing the delivery of the at least one stimulus.

14. The method of claim 1, wherein a trainer of the animal controls the first device.

15. The method of claim 1, wherein the animal wears the second device.

16. The method of claim 1, wherein the first device comprises a handheld transceiver and the second device comprises a remote collar.

17. The method of claim 1, wherein the at least one stimulus comprises a negative stimulus.

18. The method of claim 1, wherein the at least one stimulus comprises a positive stimulus.

19. The method of claim 1, wherein the first virtual device mimics the functionality of the first device.

20. The method of claim 1, wherein the second virtual device mimics the functionality of the second device.

21. The method of claim 20, wherein a virtual animal moves about the virtual training environment to mirror real world behavior of the animal, wherein the virtual animal wears the second virtual device.

22. The method of claim 21, wherein the virtual representation of a trainer in the virtual environment carries the first virtual device.

23. The method of claim 22, the simulating including manipulating the virtual representation of the owner, functionality of the first virtual device and functionality of the second virtual device through at least one peripheral device coupled to the computing device.

24. The method of claim 23, the at least one peripheral device including voice recognition capability.

25. The method of claim 23, the simulating including detecting at least one error in the manipulating the virtual representation of the owner, functionality of the first virtual device and functionality of the second virtual device through at least one peripheral device coupled to the computing device, the detecting the at least one error in the manipulating including evaluating the manipulating in accordance with the optimal training protocol.

26. The method of claim 25, the detecting the at least one error including providing information for avoiding the at least one error.

27. The method of claim 26, the detecting the at least one error including generating a score based on an occurrence rate of the at least one error.

28. The method of claim 23, wherein the virtual animal performs the at least one negative behavior.

29. The method of claim 28, the simulating including using the at least one peripheral device to administer the at least one stimulus.

30. The method of claim 23, the simulating including issuing a virtual command to perform the at least one positive behavior using the at least one peripheral device and administering the at least one stimulus.

31. The method of claim 30, the simulating including ceasing administering the at least one stimulus upon the performing the at least one positive behavior.

32. The method of claim 31, wherein the virtual command comprises a verbal command.

\* \* \* \* \*